United States Patent
Mihara et al.

(10) Patent No.: US 12,249,475 B2
(45) Date of Patent: Mar. 11, 2025

(54) DISCONNECT DEVICE

(71) Applicant: Panasonic Intellectual Property Management Co., Ltd., Osaka (JP)

(72) Inventors: Hiroyuki Mihara, Hyogo (JP); Hayato Ashida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 18/550,966

(22) PCT Filed: Jan. 24, 2022

(86) PCT No.: PCT/JP2022/002322
§ 371 (c)(1),
(2) Date: Sep. 17, 2023

(87) PCT Pub. No.: WO2022/215318
PCT Pub. Date: Oct. 13, 2022

(65) Prior Publication Data
US 2024/0170245 A1    May 23, 2024

(30) Foreign Application Priority Data
Apr. 6, 2021    (JP) .................................. 2021-064504

(51) Int. Cl.
*H01H 85/47*    (2006.01)
*H01H 45/00*    (2006.01)
*H01H 85/02*    (2006.01)

(52) U.S. Cl.
CPC ............ *H01H 85/47* (2013.01); *H01H 45/00* (2013.01); *H01H 2085/025* (2013.01)

(58) Field of Classification Search
CPC .. H01H 85/47; H01H 45/00; H01H 2085/025; H01H 9/52; H01H 50/04; H02H 3/087; H05K 7/20
See application file for complete search history.

(56) References Cited

U.S. PATENT DOCUMENTS

2014/0192457 A1*    7/2014    Zhao ...................... H01R 11/09
                                                        361/624
2017/0150630 A1*    5/2017    Lyon .................... H01M 10/425
(Continued)

FOREIGN PATENT DOCUMENTS

CN    109131164 A   *   1/2019   ......... B60R 16/0231
WO    2020/100612       5/2020

OTHER PUBLICATIONS

Shen Lei; Li Delian; Yuan Chengchao; Zhou Peng, "Electric control module and system for electric vehicle", Jan. 4, 2019, Sinoev Hefei Tech Co Ltd, Entire Document (Translation of CN 109131164). (Year: 2019).*

(Continued)

Primary Examiner — Stephen S Sul
(74) Attorney, Agent, or Firm — Greenblum & Bernstein, P.L.C.

(57) ABSTRACT

A disconnect device includes a cooling device having first and second main surfaces opposite to each other, a first insulator contacting the first main surface, a second insulator contacting the second main surface, a charging relay and a first discharging relay which contact a surface of the first insulator opposite to a surface of the first insulator contacting the first insulator, a protector contacting a surface of the second insulator opposite to a surface of the second insulator contacting the second main surface, a first power storage terminal configured to be connected to a first electrode of the power storage element, a second power storage terminal configured to be connected to a second electrode of the (Continued)

power storage element. The charging relay is separated from the discharging relay via a space between the charging relay and the discharging relay. At least a part of the protector faces the space across the first insulator, the cooling device, and the second insulator.

8 Claims, 4 Drawing Sheets

(56) References Cited

U.S. PATENT DOCUMENTS

| | | | |
|---|---|---|---|
| 2020/0194996 A1* | 6/2020 | Fisher | .................. H05K 7/2089 |
| 2021/0383985 A1 | 12/2021 | Mori et al. | |
| 2022/0015220 A1* | 1/2022 | Fujimura | ................. H02G 5/10 |
| 2022/0093354 A1* | 3/2022 | Motohashi | ........... H01H 50/042 |
| 2023/0156967 A1* | 5/2023 | Igura | ..................... H01H 50/12 |
| | | | 361/704 |

OTHER PUBLICATIONS

International Search Report of PCT application No. PCT/JP2022/002322 dated Mar. 22, 2022.

\* cited by examiner

DISCONNECT DEVICE

TECHNICAL FIELD

The present disclosure relates to a disconnect device to be used in electronic equipment for various vehicles.

BACKGROUND ART

A conventional disconnect device includes a base, relays fixed to the base, and a protection device for protecting the relays or devices connected to the relays when an overcurrent flows through the relays. In the conventional disconnect device, the relays are separated with large intervals from each other, thereby suppressing a temperature rise in the relays and the protection device.

PTL 1 discloses a conventional disconnect device similar to the above disconnect device.

CITATION LIST

Patent Literature

PTL 1: International Publication No. WO2020/100612

SUMMARY

A disconnect device is configured to operate together with a power storage element including a first electrode and a second electrode. The disconnect device includes a cooling device having a first main surface and a second main surface opposite to the first main surface; a first insulator having a first surface and a second surface opposite to the first surface, the first surface contacting the first main surface of the cooling device; a second insulator having a first surface and a second surface opposite to the first surface of the second insulator, the first surface of the second insulator contacting the second main surface of the cooling device; a first charging relay contacting the second surface of the first insulator, the first charging relay including a first terminal and a second terminal; a first discharging relay contacting the second surface of the first insulator, and including a first terminal and a second terminal; a protector contacting the second surface of the second insulator, the protector including a first terminal and a second terminal; a first power storage terminal configured to be connected to the first electrode of the power storage element; a second power storage terminal configured to be connected to the second electrode of the power storage element; a first charging terminal; a second charging terminal; a first output terminal; a second output terminal; a first conductor connecting the first terminal of the protector to the first power storage terminal; a second conductor connecting the second terminal of the protector to the first terminal of the first discharging relay; a third conductor connecting the second terminal of the protector to the first terminal of the first charging relay; a fourth conductor connecting the second terminal of the first discharging relay to the first output terminal; a fifth conductor connecting the second terminal of the first charging relay to the first charging terminal; a sixth conductor connecting the second power storage terminal to the second output terminal; and a seventh conductor connecting the second power storage terminal to the second charging terminal. The first charging relay is separated from the first discharging relay via a space between the first charging relay and the first discharging relay. At least a part of the protector faces the space across the first insulator, the cooling device, and the second insulator. This disconnect device enhances operation reliability while having a small size.

DESCRIPTION OF EMBODIMENT

Figure 1:
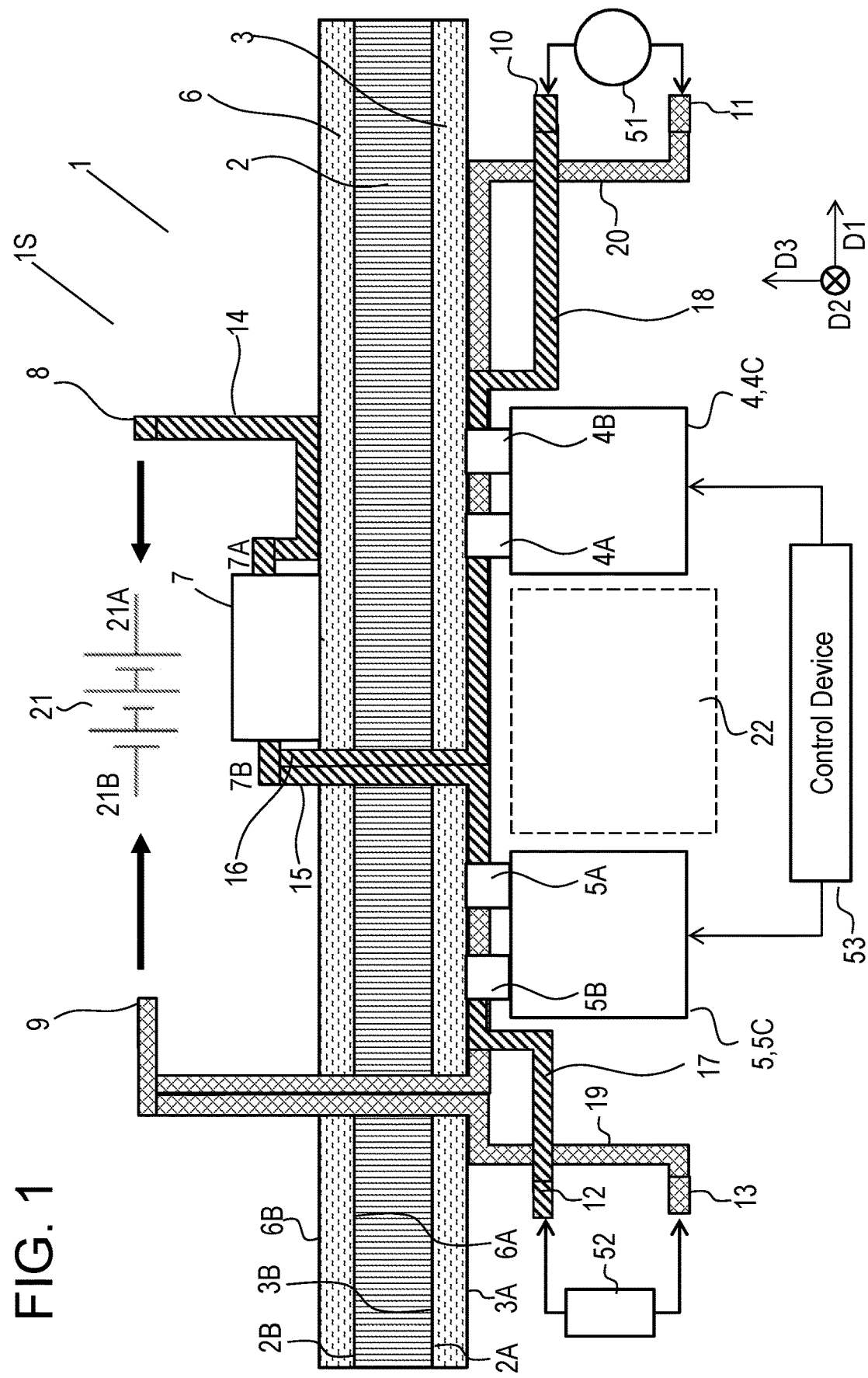
FIG. 1 is a schematic structural diagram of a disconnect device in accordance with an exemplary embodiment of the present disclosure.
Figure 2:
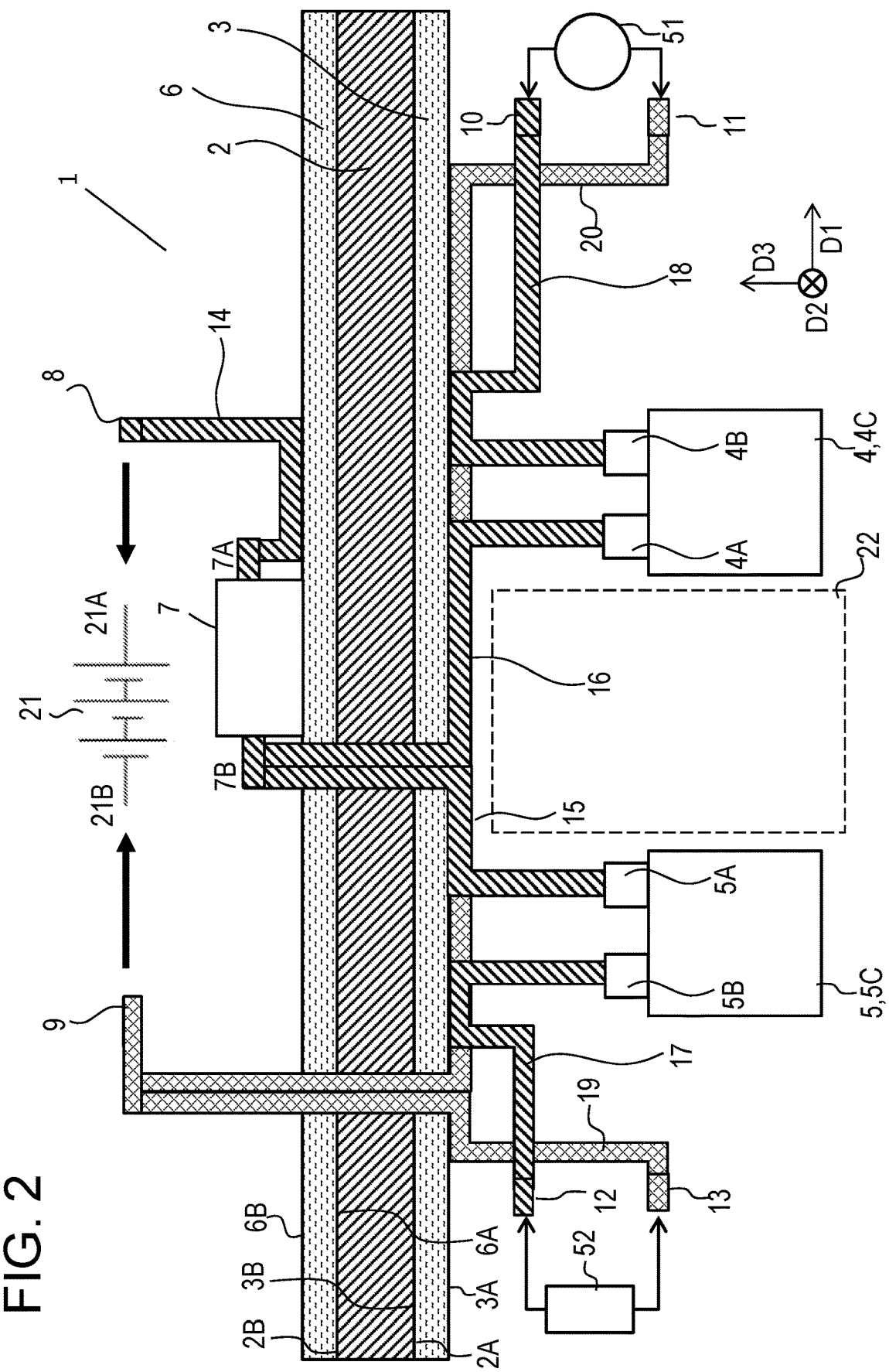
FIG. 2 is a schematic structural diagram of the disconnect device shown in FIG. 1 for showing a configuration thereof.

FIG. 1 is a structural schematic diagram of disconnect device 1 in accordance with an exemplary embodiment of the present disclosure. FIG. 2 is a structural schematic diagram showing a configuration of disconnect device 1.

Disconnect device 1 includes cooling device 2, insulator 3, charging relay 4, discharging relay 5, insulator 6, protector 7, power storage terminal 8, power storage terminal 9, charging terminal 10, charging terminal 11, output terminal 12, output terminal 13, conductor 14, conductor 15, conductor 16, conductor 17, conductor 18, conductor 19, and conductor 20.

Cooling device 2 is a water-cooling type, air-cooling type, or oil-cooling type cooling device having main surface 2A and main surface 2B opposite to main surface 2A, and is configured to cool main surfaces 2A and 2B. Insulator 3 contacts main surface 2A of cooling device 2. Specifically, insulator 3 has surface 3B contacting main surface 2A of cooling device 2, and has surface 3A opposite to surface 3B. Charging relay 4 and discharging relay 5 contact surface 3A of insulator 3. Charging relay 4 includes terminal 4A and terminal 4B. Discharging relay 5 includes terminal 5A and terminal 5B. Insulator 6 contacts main surface 2B of cooling device 2. Specifically, insulator 6 has surface 6A contacting main surface 2B of cooling device 2, and has surface 6B opposite side to surface 6A. Protector 7 contacts surface 6A of insulator 6. Protector 7 includes terminal 7A and terminal 7B. Protector 7 is configured to provide conduction between terminals 7A and 7B when an overcurrent does not flow across terminals 7A and 7B, and not to provide conduction between terminals 7A and 7B when an overcurrent flows across terminals 7A and 7B. In accordance with the embodiment, protector 7 is a fuse configured to blow with heat generated by an electric current.

FIG. 1 shows actual disconnect device 1 in accordance with the embodiment in which charging relay 4 and discharging relay 5 contact insulator 3. FIG. 2 shows disconnect device 1 in which charging relay 4 and discharging relay 5 do not contact insulator 3 just for explanation.

Power storage terminal 8 is connected to electrode 21A of power storage element 21. Power storage terminal 9 is connected to electrode 21B of power storage element 21. Power storage element 21 is configured to be charged with an electric current supplied to electrodes 21A and 21B, and to be discharged to supply a voltage from electrodes 21A and 21B.

Conductor 14 connects terminal 7A of protector 7 to power storage terminal 8. Conductor 15 connects terminal 7B of protector 7 to terminal 5A of discharging relay 5. Conductor 16 connects terminal 7B of protector 7 to terminal 4A of charging relay 4. Conductor 17 connects terminal 5B of discharging relay 5 to output terminal 12. Conductor 18 connects terminal 4B of charging relay 4 to charging terminal 10. Conductor 19 connects power storage terminal 9 to output terminal 13. Conductor 20 connects power storage terminal 9 to charging terminal 11. FIGS. 1 and 2 particularly show paths through which conductors 15, 16, 19, and 20 pass through insulator 3, cooling device 2, and insulator 6.

Space 22 separates charging relay 4 from discharging relay 5 with space 22 between charging relay 4 and discharging relay 5. At least a part of protector 7 is disposed at a position facing space 22 across insulator 3, cooling device 2, and insulator 6 interposed between protector 7 and space 22. In accordance with the embodiment, insulator 3, cooling device 2, and insulator 6 are interposed between space 22 and at least a part of protector 7 in a direction D3 perpendicular to main surfaces 2A and 2B of cooling device 2 and surfaces 3A,3B, 6A, and 6B of insulators 3 and 6, insulator 3, cooling device 2, and insulator 6. That is, in accordance with the embodiment, at least a part of protector 7 faces space 22 across insulator 3, cooling device 2, and insulator 6 in the direction D3.

This configuration hardly allows heat generated from charging relay 4 and discharging relay 5 disposed on one main surface 2A of cooling device 2 to affect protector 7 provided on main surface 2B opposite to cooling device 2, thereby efficiently cooling charging relay 4, discharging relay 5, and protector 7. In addition, the configuration in which insulator 3, cooling device 2, and insulator 6 are interposed between protector 7 and space 22 reduces a length of conductor 15 to which electric power from power storage element 21 is supplied, and reduces heat generated in conductor 15 due to increase in a direct current resistance of conductor 15 in which a large electric current is frequently supplied from power storage element 21.

This configuration suppresses a temperature rise in disconnect device 1 and enhances operation reliability of disconnect device 1 even if charging relay 4, discharging relay 5, and protector 7 are densely arranged.

In the above-described conventional disconnect device, in the case that relays are arranged with large intervals for preferentially suppressing a temperature rise, the size of the disconnect device is increased. On the other hand, in the case that the relays are arranged with small intervals between them, a temperature rise in the relays or the protection device easily occurs during operation, which may deteriorate the operation reliability of the disconnect device.

On the contrary, disconnect device 1 of the embodiment suppresses the temperature rise of disconnect device 1 and enhances the operation reliability even if charging relays 4 and discharging relays 5 and protector 7 are densely arranged.

Disconnect device 1 will be detailed below with reference to FIGS. 1 and FIG. 2. As described above, disconnect device 1 includes cooling device 2, insulator 3, charging relays 4, discharging relays 5, insulator 6, protector 7, power storage terminal 8, power storage terminal 9, charging terminal 10, charging terminal 11, output terminal 12, output terminal 13, conductor 14, conductor 15, conductor 16, conductor 17, conductor 18, conductor 19, and conductor 20.

Conductors 14, 15, 16, 17, 18, 19, and 20 are busbars of conductors each of which is formed by bending or linearly forming a single copper plate with a large thickness. Cooling device 2 substantially has a plate shape including wide main surfaces 2A and 2B and end surfaces which are connected to main surfaces 2A and 2B and are narrower than main surfaces 2A and 2B. The width of cooling device 2 in the depth direction in the drawings, that is, in direction D2 perpendicular to direction D1 in which charging relays 4, space 22, and discharging relays 5 are arranged and parallel to main surfaces 2A and 2B is larger than the width of the busbars mentioned above in the direction D2.

Insulators 3 and 6 are disposed on cooling device 2 to contact cooling device 2. Insulators 3 and 6 may be provided as insulating layers, or may be plate-shaped structural bodies made of resin contacting cooling device 2. Insulators 3 and 6 may be box-shaped structural bodies including plate-shaped structural bodies formed of resin contacting cooling device 2. Insulators 3 and 6 may be formed of both an insulating layer and a resin structural body. In particular, for insulator 3, since charging relay 4 and discharging relay 5 have larger weights than protector 7, and since charging relay 4 and discharging relay 5 generate mechanical vibration, insulator 3 preferably has a resin structural body and holds parts of charging relay 4 and discharging relay 5. Protector 7 is implemented by, for example, a fuse. Therefore, insulator 6 may include only an insulating layer, and may have smaller mechanical rigidity than insulator 3.

Insulator 3 contacts charging relay 4 and discharging relay 5. Insulator 3 may contact outer covering body 4C of charging relay 4 and outer covering body 5C of discharging relay 5. Alternatively, insulator 3 may contact terminals 4A and 4B of charging relay 4, and contact terminals 5A and 5B of discharging relay 5. Terminals 4A and 4B of charging relay 4 are configured to be connected to each other and to be disconnected from each other, and switching between the connecting and the disconnecting is controlled by control device 53 provided at the outside of disconnect device 1. Similarly, terminals 5A and 5B of discharging relay 5 are configured to be connected to each other and to be disconnected from each other, and switching between the connecting and the disconnecting is controlled by control device 53.

Power storage terminal 8 is configured to be connected to electrode 21A of power storage element 21, and power storage terminal 9 is configured to be connected to electrode 21B of power storage element 21. Power storage element 21 is a secondary battery having a high voltage, for example, a lithium battery, provided at the outside of disconnect device 1. Electrode 21A may be a positive electrode and electrode 21B may be a negative electrode, or electrode 21A may be a negative electrode and electrode 21B may be a positive electrode. In this Example, electrode 21A is a positive electrode and electrode 21B is a negative electrode. Power storage element 21 and disconnect device 1 constitute disconnect system 1S.

Charging terminal 10 and charging terminal 11 are configured to be connected to power feeding device 51 provided at the outside of disconnect device 1 for charging power storage element 21. Power feeding device 51 is configured to supply electric power to charging terminal 10 and charging terminal 11. Output terminal 12 and output terminal 13 are configured to be connected to load 52 for supplying electric power from power storage element 21. Load 52 is, for example, a drive device, such as motor, for driving vehicles. A very large value of electric current may be temporarily supplied to load 52 from output terminal 12 and output terminal 13, which is a large value as compared with a current flowing to charging terminal 10 and charging terminal 11 for charging power storage element 21.

Conductor 14 connects terminal 7A of protector 7 to power storage terminal 8. Conductor 14 and power storage terminal 8 be preferably made of a single conductor. Power storage terminal 8 is configured to be connected to electrode 21A of power storage element 21. Power storage terminal 8 may include a fixing fastener to be connected to electrode 21A. Conductor 14 may be connected to terminal 7A of protector 7 with the fixing fastener.

Conductor 15 connects terminal 7B of protector 7 to terminal 5A of discharging relay 5. Conductor 16 connects terminal 7B of protector 7 to terminal 4A of charging relay 4. Terminal 7B is connected to conductor 15 and conductor 16 with the fixing fastener.

Conductor 17 connects terminal 5B of discharging relay 5 to output terminal 12. Conductor 17 and output terminal 12 may preferably made of a single conductor. Output terminal 12 is configured to be connected to load 52. Output terminal 12 may include a fixing fastener to be connected to load 52. Terminal 5A of discharging relay 5 is disposed closer to terminal 7B of protector 7 than terminal 5B of discharging relay 5.

Conductor 18 connects terminal 4B of charging relay 4 to charging terminal 10. Conductor 18 and charging terminal 10 may preferable be made of a single conductor. Charging terminal 10 is configured to be connected to power feeding device 51. Charging terminal 10 may include a fixing fastener to be connected to power feeding device 51. Terminal 4A of charging relay 4 is disposed closer to terminal 7B of protector 7 than terminal 4B of charging relay 4.

Conductor 19 connects power storage terminal 9 to output terminal 13. Conductor 19 and output terminal 13 my preferably be made of a single conductor. Output terminal 13 preferably includes a fixing fastener to be connected to load 52.

Conductor 20 connects power storage terminal 9 to charging terminal 11. Conductor 20 and charging terminal 11 may preferably be made of a single conductor. Charging terminal 11 may include a fixing fastener to be connected to power feeding device 51.

Conductor 19, conductor 20, and power storage terminal 9 are connected to one another with the fixing fasteners.

The connecting and fixing between conductor 15 and terminal 5A of discharging relay 5, the connecting and fixing between conductor 17 and terminal 5B of discharging relay 5, the connecting and fixing between conductor 16 and terminal 4A of charging relay 4, and the connecting and fixing between conductor 18 and terminal 4B of charging relay 4 are performed with fixing fasteners, and a region of each of the above-mentioned connecting and fixing is thermally bonded to insulator 3.

FIG. 1 and FIG. 2 show a state in which conductor 15, conductor 16, conductor 19, and conductor 20 pass through insulator 3, cooling device 2, and insulator 6. However, conductor 15, conductor 16, conductor 19, and conductor 20 do not necessarily pass through insulator 3, cooling device 2, and insulator 6, and may be drawn around the edges of insulator 3, cooling device 2, and insulator 6 for connecting the members on main surface 2A of cooling device 2, 3A.

In this configuration, a region in which the main bodies of charging relay 4 and discharging relay 5 which easily generate heat with coils or the like for operation inside thereof are connected and fixed to the charging relay 4 and discharging relay 5 that easily generate heat with contact resistance with the conductor as a bas bar is disposed on main surface 2A of one of main surfaces 2A and 2B of cooling device 2. Protector 7, particularly a fuse, which may be adversely affected by heat in operation property, is disposed on main surface 2B of cooling device 2. In this arrangement, the heat generated by charging relay 4 and discharging relay 5 disposed on one main surface 2A of cooling devices 2 does not easily affect protector 7 positioned in another main surface 2B opposite to main surface 2A of the cooling device 2. Furthermore, cooling members are dispersed on both surfaces of main surfaces 2A and 2B of cooling device 2. Thus, almost an entire surface of cooling device 2 is cooled, thus efficiently cooling parts to be cooled, for example, charging relay 4, discharging relay 5, and protector 7. In addition, insulator 3, cooling device 2, and insulator 6 face space 22 between protector 7 and space 22 for separating charging relay 4 and discharging relay 5 from each other. Therefore, in particular, conductor 15 corresponding to a path for supplying a large electric current and large electric power to load 52 from power storage element 21 can be shortened. This configuration suppresses heat generation in conductor 15 due to the increase in the direct current resistance value of conductor 15 that is connected to a position where a large current is frequently supplied from power storage element 21.

This configuration thus easily suppresses the temperature rise of disconnect device 1 and enhances operation reliability of disconnect device 1 even if charging relay 4, discharging relay 5, and protector 7 are densely arranged.

Conductor 15 and conductor 16 preferably contact surface 3A of insulator 3. Thus, heat propagating from charging relay 4 and discharging relay 5 to conductor 15 and conductor 16, and heat generated according to the flow of electric current to conductor 15 and conductor 16 can be efficiently transmitted to cooling device 2 via insulator 3. Conductor 15 and conductor 16 are bus bars made of copper plates having substantially a rectangular cross section, and wide surfaces of conductor 15 and conductor 16 contact insulator 3. Furthermore, an entire of conductor 15 and conductor 16 does not necessarily contact insulator 3, and a part of conductor 15 and conductor 16 may contact insulator 3.

Conductor 15 may be shorter than conductor 16. As described above, conductor 15 corresponds to a path on the positive electrode side, where large electric current and high electric power are supplied to load 52 from power storage element 21. On the other hand, conductor 16 corresponds to a path on the positive electrode side, where electric power is supplied from power feeding device 51 to power storage element 21, a time during which electric current smaller than the electric current flowing in conductor 15 flows is long. Therefore, conductor 15 may be preferably shorter than conductor 16 to reducing the direct current resistance so as to suppress generation or loss of heat.

Conductor 19 and conductor 20 may contact surface 3A of insulator 3. Heat generated due to electric current flowing to conductor 19 and conductor 20 is efficiently transmitted to cooling device 2 and released via insulator 3. Conductor 19 and conductor 20 are bus bars made of copper plates having substantially rectangular cross sections, and configured such that wide surfaces of conductor 19 and conductor 20 contact insulator 3. An entirety of conductor 19 and conductor 20 does not necessarily contact insulator 3, and a part of conductor 19 and conductor 20 may contact insulator 3.

Conductor 19 and also conductor 20 may be short. Conductor 19 corresponds to a path close to the negative electrode where large electric current and high electric power are supplied to load 52 from power storage element 21. On the other hand, conductor 20 corresponds to an electric power supplying path close to the negative electrode, where electric power is supplied from power feeding device 51 to power storage element 21. In comparison, a time during which electric current smaller than the electric current flowing in conductor 19 flows is long. Therefore, conductor 19 may preferably be smaller than conductor 20 to reduce the direct current resistance to suppress the heat generation or loss.

Figure 3:
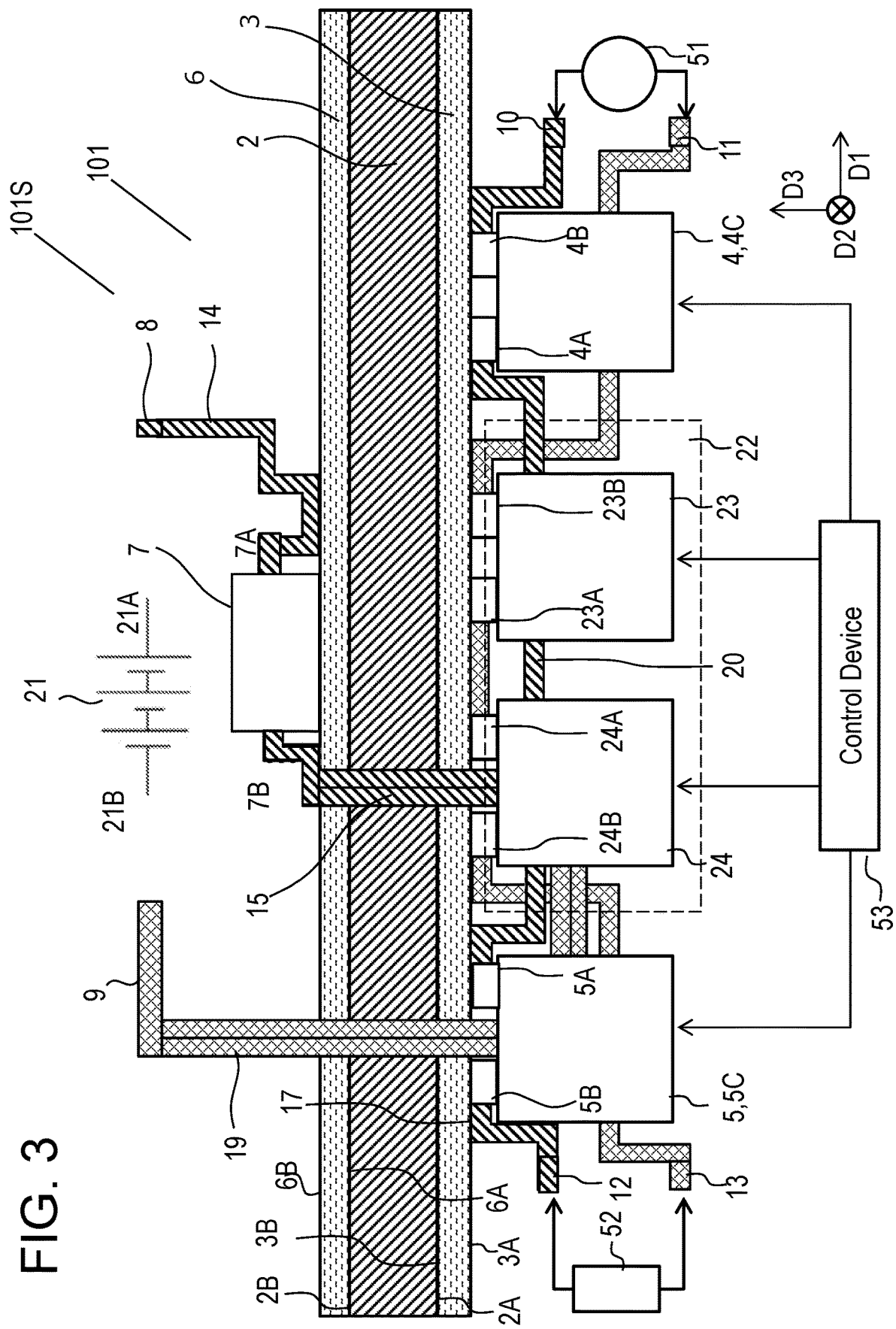
FIG. 3 is a schematic structural diagram of another disconnect device in accordance with the embodiment.
Figure 4:
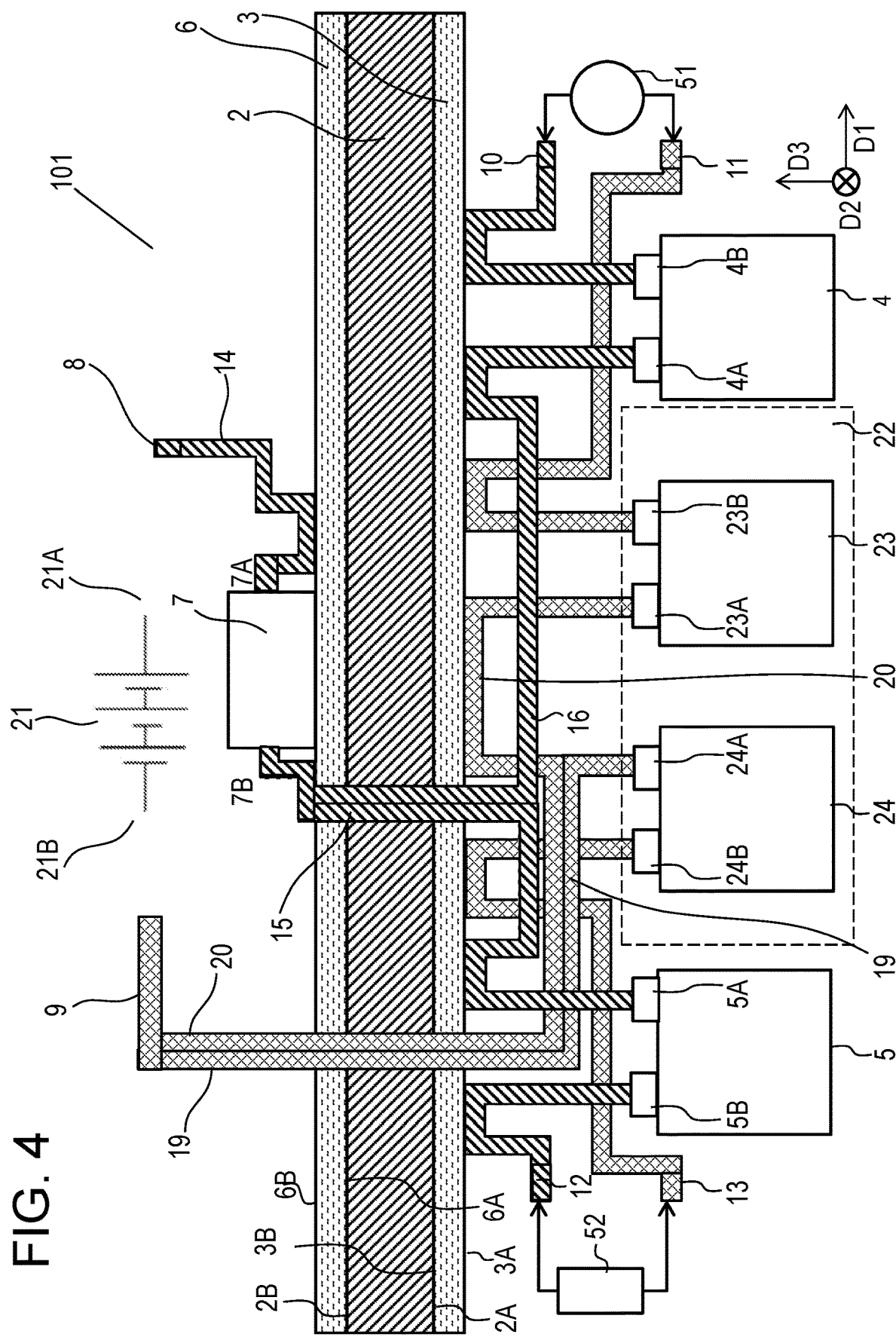
FIG. 4 is a schematic structural diagram of the disconnect device shown in FIG. 3 for showing a configuration thereof.

FIG. 3 is a schematic structural diagram of another disconnect device 101 in accordance with the embodiment of the present disclosure. FIG. 4 is a schematic structural diagram of disconnect device 101 for showing a configuration thereof. In FIG. 3 and FIG. 4, components identical to those of disconnect device 1 shown in FIG. 1 and FIG. 2 are denoted by the same reference numerals. Disconnect device 101 further includes charging relay 23 and discharging relay 24 which contact surface 3A of insulator 3. Discharging relay 24 is configured to connect conductor 19 to output terminal 13. Conductor 19 is connected to terminal 24A of discharging relay 24, output terminal 13 is connected to terminal 24B of discharging relay 24. Charging relay 23 is configured to connect conductor 20 to charging terminal 11. Conductor 20 is connected to terminal 23A of charging relay 23, and charging terminal 11 is connected to terminal 23B of charging relay 23. Power storage element 21 and disconnect device 101 constitute disconnect system 101S.

Similarly to FIG. 1 and FIG. 2 mentioned above, FIG. 3 shows disconnect device 101 as the actual embodiment in a state that charging relay 23 and discharging relay 24 contact insulator 3, but FIG. 4 shows disconnect device 101 in a state in which charging relay 23 and discharging relay 24 do not contact insulator 3 just for explanation.

Charging relay 23 is configured to connect terminal 23A to terminal 23B and disconnect terminal 23A from terminal 23B, and switching between the connecting and the disconnecting is controlled by control device 53 provided at the outside of disconnect device 101. Similarly, discharging relay 24 is configured to connect terminal 24A to terminal 24B of discharging relay 24 and disconnect terminal 24A from terminal 24B, switching between the connecting and the disconnecting is controlled by control device 53 provided at the outside of disconnect device 101.

Output terminal 13 and charging terminal 11 are connected to electrode 21B corresponding to the negative electrode of power storage element 21 via charging relay 23 and discharging relay 24. Thus, the connecting and disconnecting between power storage element 21 and load 52 and between power feeding device 51 and power storage element 21 on the positive electrode side and on the negative electrode side are possible, enhancing the operation reliability of disconnect device 1.

Charging relay 23 and discharging relay 24 are preferably disposed in space 22. Charging relay 23 is preferably disposed between discharging relay 24 and charging relay 4. Alternatively, charging relay 23 may be disposed adjacent to discharging relay 24 and charging relay 4. Conductor 19 is shorter than conductor 15, and conductor 20 is shorter than conductor 16.

This configuration reduces direct current resistance of conductor 19 and conductor 20, and suppresses heat generated when a large electric current is applied to conductor 19 and conductor 20, thus reducing the effect of the heat on power storage element 21. On the other hand, conductor 15 and conductor 16 in which electric current substantially the same electric current as conductor 19 and conductor 20 flows generate larger heat than conductor 19 and conductor 20. But conductor 15 and conductor 16 are connected to power storage element 21 via conductor 14 and protector 7 partially connected to conductor 15. Therefore, the effect of heat on power storage element 21 is relieved by protector 7 and conductor 14.

The temperature of protector 7 during operation of disconnect device 1 may be lower than the temperature of charging relay 4 and discharging relay 5 during operation of disconnect device 1. In addition, the temperature of protector 7 during operation of disconnect device 1 may be lower than the temperature of charging relay 23 and discharging relay 24 during operation of disconnect device 1. In other words, a temperature range in which protector 7 normally operate may be in a lower range than the temperature range in which charging relay 4, discharging relay 5, charging relay 23, and discharging relay 24 can operate normally. In this case, the upper limit of the temperature range in which protector 7 normally operates may be lower than the lower limit in the temperature range in which charging relays 4 and 23 and discharging relays 5 and 24 operate normally.

Protector 7 is disposed close to main surface 2B of cooling device 2, and obtains a larger cooling effect than charging relay 4, discharging relay 5, charging relay 23, and discharging relay 24 that are concentratedly disposed on the main surface 2A of cooling device 2, so that a temperature rise can be suppressed.

INDUSTRIAL APPLICABILITY

A disconnect device of the present disclosure has an advantageous effect of enhancing operation reliability, and is useful for electronic equipment for various vehicles.

REFERENCE SIGNS LIST 1 disconnect device
2 cooling device
2A main surface (first main surface)
2B main surface (second main surface)
3 insulator (first insulator)
4 charging relay (first charging relay)
5 discharging relay (first discharging relay)
6 insulator (second insulator)
7 protector
8 power storage terminal (first power storage terminal)
9 power storage terminal (second power storage terminal)
10 charging terminal (first charging terminal)
11 charging terminal (second charging terminal)
12 output terminal (first output terminal)
13 output terminal (second output terminal)
14 conductor (first conductor)
15 conductor (second conductor)
16 conductor (third conductor)
17 conductor (fourth conductor)
18 conductor (fifth conductor)
19 conductor (sixth conductor)
20 conductor (seventh conductor)
21 power storage element
21A electrode (first electrode)
21B electrode (second electrode)
22 space
23 charging relay (second charging relay)
24 discharging relay (second discharging relay)

The invention claimed is:

1. A disconnect device configured to operate together with a power storage element including a first electrode and a second electrode, the disconnect device comprising:
   a cooling device having a first main surface and a second main surface opposite to the first main surface;
   a first insulator having a first surface and a second surface opposite to the first surface, the first surface contacting the first main surface of the cooling device;

a second insulator having a first surface and a second surface opposite to the first surface of the second insulator, the first surface of the second insulator contacting the second main surface of the cooling device;

a first charging relay contacting the second surface of the first insulator, the first charging relay including a first terminal and a second terminal;

a first discharging relay contacting the second surface of the first insulator, and including a first terminal and a second terminal;

a protector contacting the second surface of the second insulator, the protector including a first terminal and a second terminal;

a first power storage terminal configured to be connected to the first electrode of the power storage element;

a second power storage terminal configured to be connected to the second electrode of the power storage element;

a first charging terminal;

a second charging terminal;

a first output terminal;

a second output terminal;

a first conductor connecting the first terminal of the protector to the first power storage terminal;

a second conductor connecting the second terminal of the protector to the first terminal of the first discharging relay;

a third conductor connecting the second terminal of the protector to the first terminal of the first charging relay;

a fourth conductor connecting the second terminal of the first discharging relay to the first output terminal;

a fifth conductor connecting the second terminal of the first charging relay to the first charging terminal;

a sixth conductor connecting the second power storage terminal to the second output terminal; and a seventh conductor connecting the second power storage terminal to the second charging terminal, wherein the first charging relay is separated from the first discharging relay via a space between the first charging relay and the first discharging relay, and at least a part of the protector faces the space across the first insulator, the cooling device, and the second insulator.

2. The disconnect device according to claim 1, wherein the second conductor and the third conductor contact the second surface of the first insulator.

3. The disconnect device according to claim 1, wherein the second conductor is shorter than the third conductor.

4. The disconnect device according to claim 1, wherein the sixth conductor and the seventh conductor contact the second surface of the first insulator.

5. The disconnect device according to claim 1, wherein the sixth conductor is shorter than the seventh conductor.

6. The disconnect device according to claim 1, further comprising a second charging relay and a second discharging relay which contact the second surface of the first insulator, wherein the second discharging relay configured to connect the sixth conductor to the second output terminal, and the second charging relay configured to connect the seventh conductor to the second charging terminal.

7. The disconnect device according to claim 6, wherein the second charging relay and the second discharging relay are disposed in the space, the sixth conductor is shorter than the second conductor, and the seventh conductor is shorter than the third conductor.

8. The disconnect device according to claim 1, wherein a temperature of the protector is lower than temperatures of the first charging relay and the first discharging relay.

* * * * *